United States Patent
Wu et al.

(10) Patent No.: US 7,243,277 B2
(45) Date of Patent: Jul. 10, 2007

(54) METHOD OF COMBINING MULTILEVEL MEMORY CELLS FOR AN ERROR CORRECTION SCHEME

(75) Inventors: Jieh-Tsorng Wu, Hsinchu (TW); Ta-Hui Wang, Hsinchu (TW); Hsie-Chia Chang, Keelung (TW)

(73) Assignee: National Chiao Tung UIniversity, Hsinchu (TW)

( * ) Notice: Subject to any disclaimer, the term of this patent is extended or adjusted under 35 U.S.C. 154(b) by 199 days.

(21) Appl. No.: 11/183,601

(22) Filed: Jul. 18, 2005

(65) Prior Publication Data
US 2006/0015793 A1    Jan. 19, 2006

(30) Foreign Application Priority Data
Jul. 16, 2004    (TW)    ............... 93121302 A

(51) Int. Cl.
*G11C 29/00*    (2006.01)
(52) U.S. Cl. .................. 714/721; 714/763
(58) Field of Classification Search ........... 714/718, 714/721, 763; 341/155; 365/185.11; 711/202
See application file for complete search history.

(56) References Cited

U.S. PATENT DOCUMENTS

| | | | |
|---|---|---|---|
| 6,279,133 B1 * | 8/2001 | Vafai et al. ................. | 714/763 |
| 6,674,385 B2 * | 1/2004 | Micheloni et al. .......... | 341/155 |
| 7,012,835 B2 * | 3/2006 | Gonzalez et al. ...... | 365/185.11 |
| 7,139,895 B2 * | 11/2006 | Hazama ..................... | 711/202 |

* cited by examiner

*Primary Examiner*—David Ton
(74) *Attorney, Agent, or Firm*—Rosenberg, Klein & Lee

(57) ABSTRACT

A memory combines plural memory cells for storing data wherein the differential stages voltage levels of memory cells are not limited in square value of 2 and can be improved linearly. The feature of the present invention can also increase memory capacity without increasing memory area. Furthermore it can remain voltage levels which cannot express 0 and 1 combination for error erasure messages when data is read. For efficient usage of memory, the increased memory capacity is not only for storing data but also for storing error correction scheme to assure the veracity of the storing data and improve producing yield and reliability for multilevel memory systems.

5 Claims, 4 Drawing Sheets

METHOD OF COMBINING MULTILEVEL MEMORY CELLS FOR AN ERROR CORRECTION SCHEME

BACKGROUND OF THE INVENTION

1. Field of the Invention

The present invention relates to a method of memory, and more particularly to a method for storing data and information related to data error correction by combining plural memory cells, which can increase memory capacity without extra area penalty.

2. Description of the Prior Art

With digital technology developing, information transmission is not limited by the space any more. Not only far-reaching transmitting on network, data can be also carried about by various memory in portable devices. However, how to assure the data transmitted exactly in transmission procedure becomes a very important job since data has to transmit and convert frequently between different interfaces and storing devices. For various memories often used nowadays, the FIG. 1 refers to their data storing procedure. When inputting a data, an error correction code generator 1 carries on the operation of error correction encoding to the data and generates the redundancy, and then assembles the redundancy to be an error correction code capable of identifying the data. Then, a programming circuit 3 writes data and error correction code into a memory device 5. The error correction code will be used to correct error 7 in the data for assuring that data can be outputted exactly.

In 1965, the cofounder, Gordon Moore, of Intel Corp. predicted that the number of silicon chip transistor had doubled every 18 months, also called "Moore's Law". The memory capacity has been increased from 8M, 16M in the earlier period to 1024M nowadays, the development of memory capacity can be treated as the best witness of 「Moore's Law」. However, it has to overcome many constrictions for achieving the higher capacity in memory cells. Enterprises have to pay more for developing techniques now.

Generally speaking, the technique of increasing memory capacity can be divided in two ways: one is to increase the number of memory cells and the other is to increase capacity of each memory cell using multilevel technique. For example, the characteristic of a multilevel cell is described by a number of curves representing different logic values. FIG. 2 shows the characteristic of a four-level (2-bit) cell which stores the bits "11", "10", "01" and "00" corresponding to different voltage levels. Although the capacity has been doubled, on the other hand, the more differential levels in particular voltage region of memory cells, the more hard to develop techniques. If the growth is limited by value of $2^m$, it indicates that memories of next generation have to be increased to 8 or even 16 voltage levels for providing 3 bits or 4 bits of each memory cell, respectively. Therefore, the experienced curve of technique development will grow exponentially for getting more voltage levels. The present invention presents an effective grouping of several q-level memory cells with $q>2^m$ in order to gaining more memory capacity in a linear manner. It is not only getting more capacity and overcoming the technical difficulties to increase the number of voltage levels in memory cells, but also rendering the present invention having error correction scheme for assuring the veracity of the storing data and improving producing yield and reliability for multilevel memory systems.

SUMMARY OF THE INVENTION

The primary object of the present invention is to provide a method for increasing memory capacity. The voltage levels of memory cell are not limited by $2^m$, and completely utilize the combination arrangement of plural memory cells for increasing memory capacity.

Another object of the present invention is to provide a method of memory having an error correction scheme. It stores the necessary parity messages of ECC (Error Correction Codes) in several multilevel memory cells that are grouped together. The present invention thus can enhance both the yield and reliability without area penalty for memory systems.

Again another object of the present invention is to provide a memory design consideration method, which is not limited by value of $2^m$. The memory formed by combining plural memory cells is not only capable of storing data, but also having residual part to indicate the erasure message for accessing data.

In order to reach the objects above, the present invention combines the extra voltage levels in memory cells for increasing memory capacity and method of storing parity messages and error erasure message in error correction scheme. The voltage levels that the present invention provides are not limited by value of $2^m$. After combining plural memory cells, due to multiplying effect between voltage levels in plural memory cells are treated as a whole for the binary computation, it can increase memory capacity to store binary value which present data, the parity messages of ECC to assure the veracity of the storing data. In addition, the residual part can be used to indicate the erasure flags to identify an error location.

The foregoing and other objects, features and advantages of the invention will be apparent from the following more particular description of preferred embodiments with reference to the accompanying diagrammatic drawings of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE SYMBOLS 20 memory cell 22 memory

DESCRIPTION OF THE PREFERRED EMBODIMENTS

Memories are typically data storing devices in computer systems nowadays. No matter RAM, ROM, EEPROM, SDRAM, etc., all of them are consisted of plural memory cells. The charge quantity of each memory cell can be divided into several sections, which are called voltage levels, for mapping different bits.

In one memory cell, the more voltage levels means the higher memory capacity. Besides increasing memory cell numbers, it can also increase capacity by increasing the number of voltage levels in memory cells. For memory capacity calculation, it usually uses $2^m$ voltage levels; in this restriction, the development of techniques is going to be hard and harder for higher memory capacity. The present invention provides a method for achieving data storing by combining memory cells that have non-$2^m$ voltage levels and cannot convert to binary completely. Those memory cells can store error correction messages of stored data.

Figure 1:
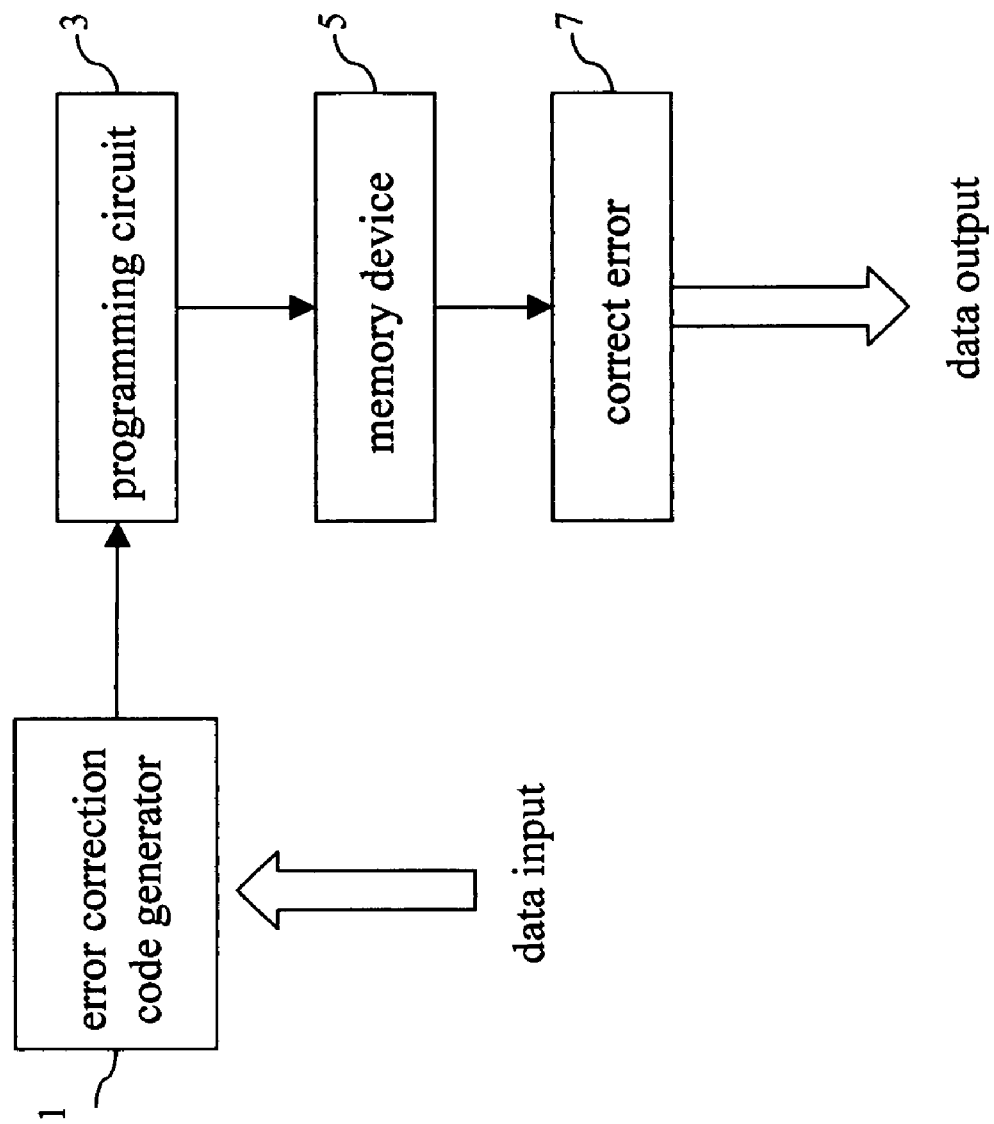
FIG. 1 is a storing data flowchart diagram of conventional memories.
Figure 2:
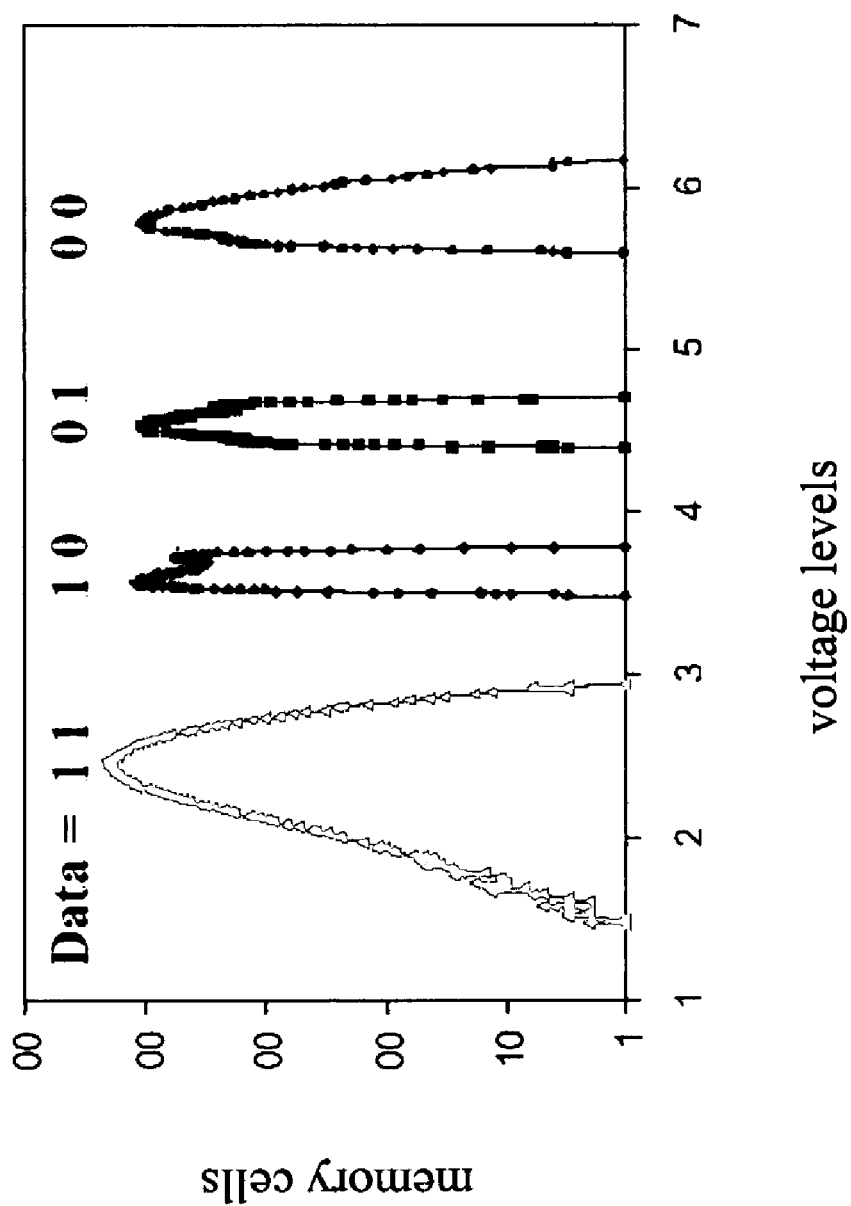
FIG. 2 is a voltage levels divided diagram of memory cells of conventional memories.
Figure 3:
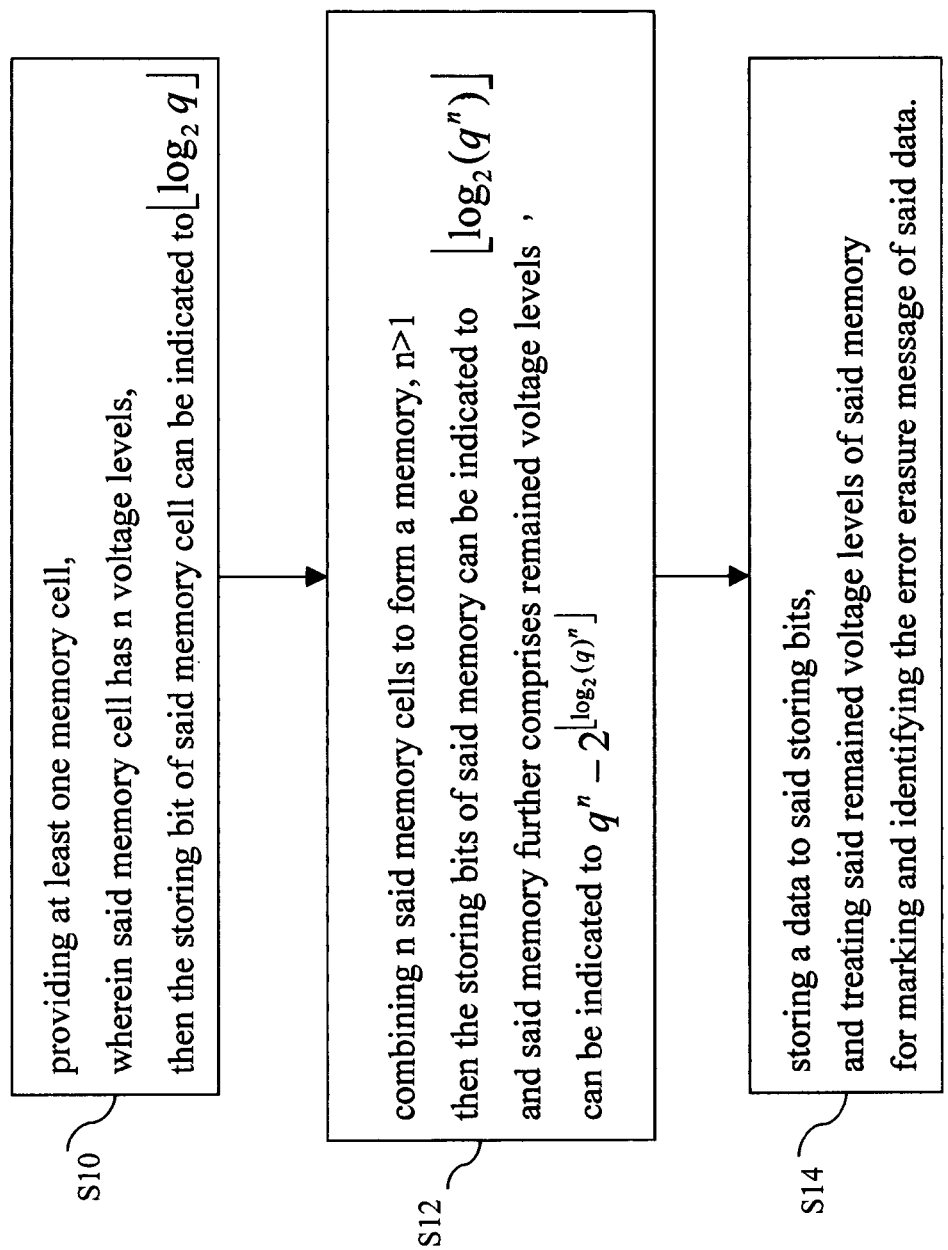
FIG. 3 is a flowchart diagram of the present invention.

FIG. 3 shows a flowchart of the present invention. It primarily comprises following steps: At first, as step S10 shown, providing at least one memory cell, wherein the memory cell is divided to q voltage levels and q is not limited by value of $2^m$. At this time, the storing bits of the memory cell can be expressed as $\lfloor \log_2 q \rfloor$ in binary operations; then, as step S12 shown, it combines n memory cells to form a memory, n>1. According to the binary operation the storing bits of memory cells are expressed $\lfloor \log_2(q)^n \rfloor$, thus higher storing capacity in the memory can be formed by combining voltage levels of memory cells. Because the memory cell's voltage levels are not $2^m$, the residual voltage levels, $q^n - 2^{\lfloor \log_2(q)^n \rfloor}$, cannot completely express 0 and 1 combinations when calculating the memory capacity. Next, when the memory has been formed, as step S14 shown, it can store the data into the storing bits of the memory cell. Moreover, although the remained voltage levels comprised in the memory can not completely express 0 and 1 combinations, the present invention groups non-$2^m$ memory cells and get some residual voltage levels from each memory cell, thus increasing memory storing capacity to store error correction messages accompanied the stored data, or mark the erasure flags to identify an error location. It does not occupy any storing space of the memory but just use the residual voltage levels which cannot present any complete bit value.

Figure 4:
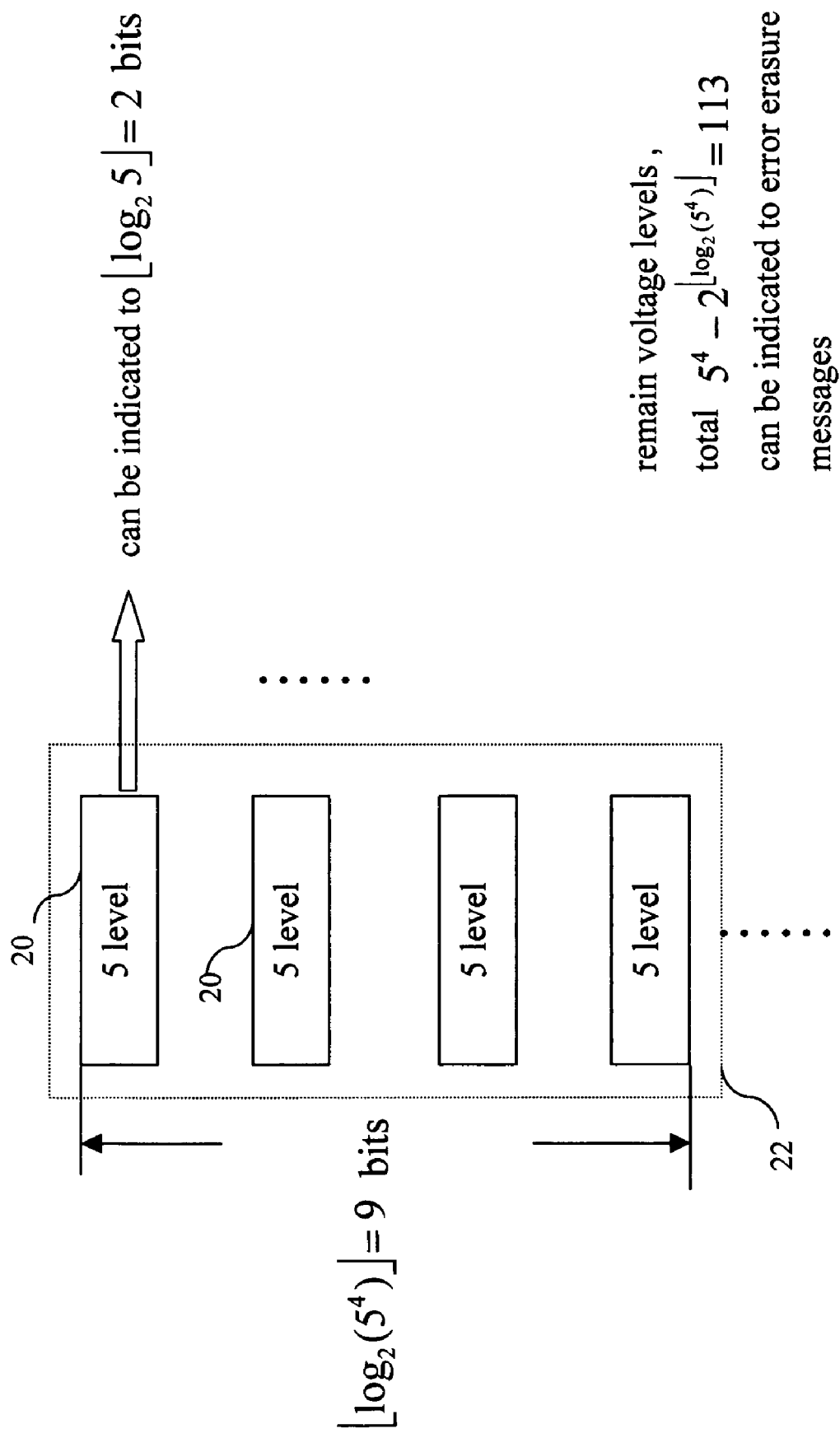
FIG. 4 is an embodiment diagram of the present invention.

For further description of the present invention, FIG. 4 is an example. A memory cell 20 have 5 voltage levels (q=5 at this time), therefore the memory cell is capable of storing $\lfloor \log_2 5 \rfloor = 2$ bits data according to the binary operation. When combining 4 memory cells 20 to form a memory 22 (n=4 at this time), it can treat voltage levels comprised in each memory cell 20 in a whole, and that means the memory 22 has $5^4 = 625$ voltage levels. It is capable of storing 9 bits data according to the binary operation. However, for 625 voltage levels, only $2^{\lfloor \log_2(5^4) \rfloor} = 512$ levels are used to indicate 0, 1 binary combinations of 9 bits completely, and the residual levels (625−512=113) cannot indicate all the 0,1 combinations of 10 bits completely. Thus, the memory 22 has 113 remained voltage levels. When the memory 22 has been formed and a data can be stored into the memory 22, the content of data and the error parity message that accompanies the data are stored in 9-bits storing space in 4 memory cells 20. Although the remained 113 voltage levels are not complete bit spaces, they are capable of marking the erasure flag of data.

Usually for data accessing the error correction scheme is used to calculate the error parity messages. No matter the way of "error detection codes" or "error correction codes", the error parity message is regarded as a part of data and stored in the memory device, thus it occupies the memory space. However, the memory design concept provided by the present invention forms a memory with higher storing capacity by combining plural multilevel memory cells whose voltage levels are not limited by value of $2^m$. Meanwhile, for comparing with conventional design of memory, with regard to the area of memory, the increased voltage levels further increase the data storing spaces and improve memory-using efficiency. Although there are residual voltage levels, which cannot completely indicate the 0, 1 combination, they can be used to mark erasure flags to identify an error location. Using the same storing spaces to assure data's veracity is not only increasing memory usage efficiently, but also assuring the veracity of the storing data and improving producing yield and reliability for multilevel memory systems.

Although the present invention has been described with reference to specific exemplary embodiments, it will be evident that various modifications and changes may be made to these embodiments without departing from the broader spirit and scope of the invention.

What is claimed is:

1. The method of combining multilevel memory cells for an error correction scheme comprising following steps:
    providing at least one memory cell, wherein said memory cell has q voltage levels and q is not limited to by value of $2^m$, m>0, then the storing bit of said memory cell can be indicated to $\lfloor \log_2 q \rfloor$;
    combining n said memory cells to form a memory, n>1, then the storing bits of said memory can be indicated to $\lfloor \log_2(q)^n \rfloor$, and said memory further comprises residual voltage levels, wherein said residual voltage levels are the voltage levels which can not present any bit and the number of residual values can be indicated to $q^n - 2^{\lfloor \log_2(q)^n \rfloor}$;
    storing a data to said storing bits $\lfloor \log_2(q)^n \rfloor$ and treating said residual voltage levels of said memory for marking the error to identify an error location of said data.

2. The method of combining multilevel memory cells for an error correction scheme according to claim 1, wherein storing said data into said memory further comprise storing at least one error parity message for checking said data into said storing bits.

3. The method of combining multilevel memory cells for an error correction scheme according to claim 1, wherein said memory considers a DRAM, a ROM, an EPROM and an EEPROM.

4. The method of combining multilevel memory cells for an error correction scheme according to claim 1, wherein said error parity message is generated by a method of error detection codes.

5. The method of combining multilevel memory cells for an error correction scheme according to claim 1, wherein said error parity message is generated by a method of error correction codes (ECC).

* * * * *